(12) United States Patent
Ahn et al.

(10) Patent No.: US 9,966,135 B2
(45) Date of Patent: May 8, 2018

(54) DATA STORAGE DEVICE AND OPERATING METHOD THEREOF

(71) Applicant: SK hynix Inc., Gyeonggi-do (KR)

(72) Inventors: Soo Hong Ahn, Gyeonggi-do (KR); Il Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/427,221

(22) Filed: Feb. 8, 2017

(65) Prior Publication Data

US 2018/0102169 A1    Apr. 12, 2018

(30) Foreign Application Priority Data

Oct. 10, 2016 (KR) .................. 10-2016-0130857

(51) Int. Cl.
*G11C 7/00* (2006.01)
*G11C 13/00* (2006.01)

(52) U.S. Cl.
CPC ...... *G11C 13/0035* (2013.01); *G11C 13/0033* (2013.01); *G11C 13/0069* (2013.01)

(58) Field of Classification Search
USPC .................................. 365/222, 210.1, 210.11
See application file for complete search history.

(56) References Cited

U.S. PATENT DOCUMENTS

| | | | |
|---|---|---|---|
| 2012/0243299 A1* | 9/2012 | Shau | G11C 7/1006 365/149 |
| 2016/0133314 A1* | 5/2016 | Hwang | G11C 11/40611 365/189.02 |
| 2017/0154688 A1* | 6/2017 | Kim | G06F 11/1451 |

FOREIGN PATENT DOCUMENTS

| | | |
|---|---|---|
| KR | 1020000014289 | 3/2000 |
| KR | 1020140100690 | 8/2014 |

* cited by examiner

*Primary Examiner* — Vu Le
(74) *Attorney, Agent, or Firm* — IP & T Group LLP (57) ABSTRACT

A data storage device includes a nonvolatile memory device including a reference memory region and a normal memory region, and suitable for determining whether to perform a refresh operation, based on the reference memory region; and a controller suitable for determining a first memory region in the normal memory region based on wear leveling operation data, and controlling the nonvolatile memory device to perform the refresh operation for a second memory region excluding the first memory region in the normal memory region.

16 Claims, 7 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean patent application number 10-2016-0130857, filed on Oct. 10, 2016, in the Korean Intellectual Property Office, which is incorporated herein by reference in its entirety.

BACKGROUND

1. Technical Field

Various embodiments generally relate to a data storage device, and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

The data storage device may be prepared in the form of a Personal Computer Memory Card International Association (PCMCIA) card, a Compact Flash (CF) card, a smart media card, a memory stick, various multimedia cards (e.g., MMC, eMMC, RS-MMC, and MMC-Micro), various secure digital cards (e.g., SD, Mini-SD, and Micro-SD), a Universal Flash Storage (UFS), a Solid State Drive (SSD) and the like.

SUMMARY

Various embodiments of the present invention are directed to a nonvolatile memory device, a data storage device employing the nonvolatile memory device and a method of operating the same.

In an embodiment, a data storage device may include: a nonvolatile memory device including a reference memory region and a normal memory region, and suitable for determining whether to perform a refresh operation, based on the reference memory region; and a controller suitable for determining a first memory region in the normal memory region based on wear leveling operation data, and controlling the nonvolatile memory device to perform the refresh operation for a second memory region excluding the first memory region in the normal memory region.

In an embodiment, a method for operating a data storage device may include: determining whether to perform a refresh operation, based on a reference memory region of a nonvolatile memory device; determining a first memory region in a normal memory region of the nonvolatile memory device based on a wear leveling operation data depending on a determination result; and performing the refresh operation for a second memory region excluding the first memory region in the normal memory region.

In an embodiment, a data storage device may include: a reference memory region; a normal memory region; and a control block suitable for monitoring a state of the reference memory region, and determining whether to perform a refresh operation on the normal memory region, based on the state of the reference memory region.

In an embodiment, a method for operating a nonvolatile memory device may include: monitoring a state of a reference memory region in the nonvolatile memory device; and determining whether to perform a refresh operation on a normal memory region in the nonvolatile memory device, based on the state of the reference memory region.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

It will be further understood that the terms "comprises," "comprising," "Includes," and "including" when used in this specification, specify the presence of the stated elements and do not preclude the presence or addition of one or more other elements.

The phrase "at least one of . . . and . . . ," when used herein with a list of items, means a single item from the list or any combination of items in the list. For example, "at least one of A, B, and C" means, only A, or only B, or only C, or any combination of A, b, and C.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
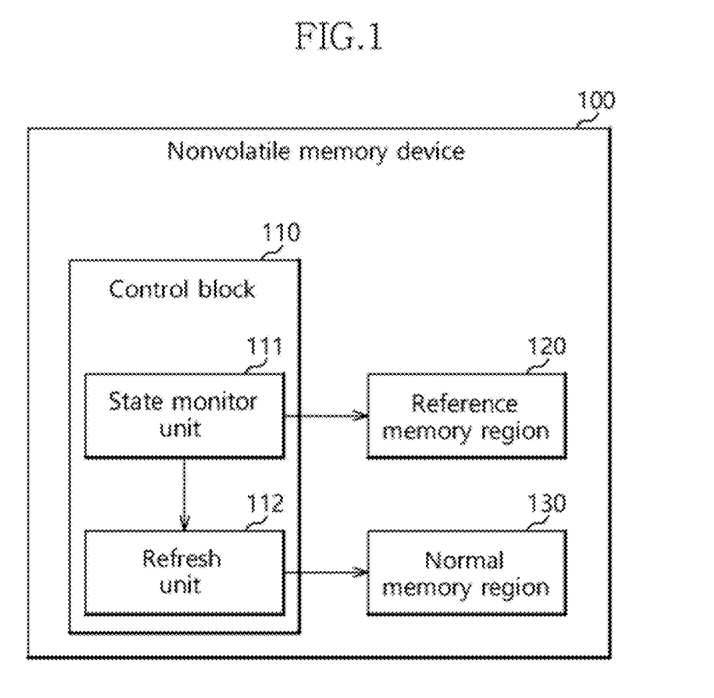
FIG. 1 is a block diagram illustrating a nonvolatile memory device in accordance with an embodiment.

FIG. 1 is a block diagram illustrating a nonvolatile memory device 100 in accordance with an embodiment.

The nonvolatile memory device 100 may store data according to control of an external controller (not shown), and retain the data stored therein, even though power is not supplied from an exterior. In the following descriptions, the nonvolatile memory device 100 may be a resistive random access memory (ReRAM). However, the embodiment of the present disclosure is not limited thereto, and the nonvolatile memory device 100 may be implemented by a flash memory, such as a NAND flash or a NOR flash, a Ferroelectrics Random Access Memory (FeRAM), a Phase-Change Random Access Memory (PCRAM), a Magnetoresistive Random Access Memory (MRAM), and the like.

The nonvolatile memory device 100 may include a control block 110, a reference memory region 120, and a normal memory region 130.

Figure 6:
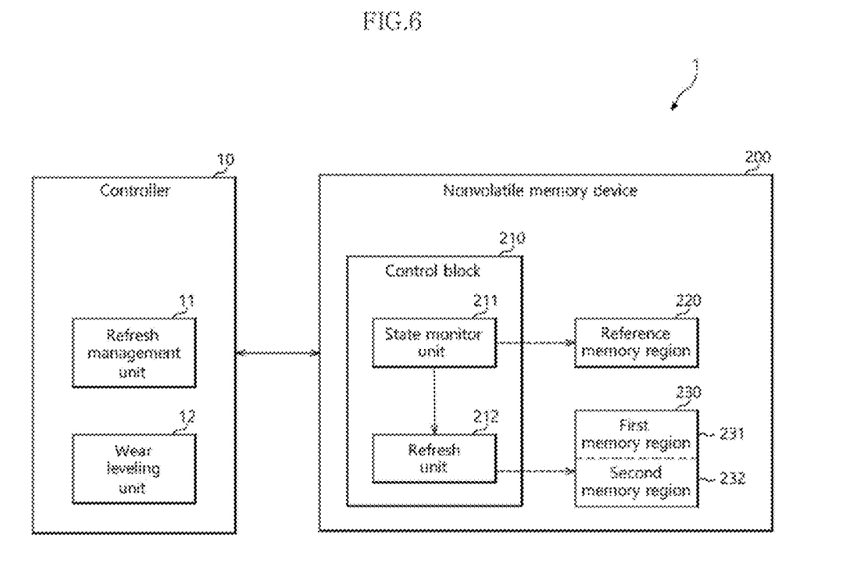
FIG. 6 is a block diagram illustrating a data storage device in accordance with an embodiment.

The control block 110 may perform not only a write operation and a read operation for the reference memory region 120 and the normal memory region 130 but also other management operations capable of ensuring the data reliability of the nonvolatile memory device 100 and extending the lifetime of the nonvolatile memory device 100, according to control of a controller for the nonvolatile memory device 100 (not shown) (e.g., a controller 10 of FIG. 6). The management operations may include a state monitor operation and a refresh operation as will be described later.

The control block 110 may include a state monitor unit 111 and a refresh unit 112.

The state monitor unit 111 may monitor the state deterioration of the reference memory region 120 to determine whether a refresh operation should be performed for the normal memory region 130. The state monitor unit 111 may determine whether the reference memory cells of the reference memory region 120 which are written to exist in a predetermined state are changed to a threshold state by a drift phenomenon. That is to say, since the reference memory cells of the reference memory region 120 have the same structure as the normal memory cells of the normal memory region 130, the state monitor unit 111 may estimate the state deterioration of the normal memory region 130 by monitoring the state deterioration of the reference memory region 120.

In detail, the state monitor unit 111 may count target reference memory cells among the reference memory cells which are written to exist in the predetermined state, and determine, when a counted number exceeds a threshold number, that a refresh operation should be performed for the normal memory region 130. The state monitor unit 111 may count a reference memory cell which has a resistance value greater than or equal to a threshold resistance value, as a target reference memory cell, among the reference memory cells.

The refresh unit 112 may perform a refresh operation for the normal memory region 130 depending on the determination of the state monitor unit 111. For example, when a determination is made by the state monitor unit 111 that the number of target reference memory cells in the reference memory region 120 is greater than and/or equal to a predetermined reference number then the control logic directs the refresh unit 112 to perform a refresh operation to the normal memory region 130. The refresh unit 112 may perform a refresh operation according to various methods generally known in the art. While the normal memory cells of the normal memory region 130 may deteriorate in their state by a drift phenomenon as time passes after a write operation is performed, they may be recovered through a refresh operation.

After performing a refresh operation for the normal memory region 130, the control block 110 may perform a write operation for the reference memory region 120 such that the reference memory cells of the reference memory region 120 exist in the predetermined state. Thus, the reference memory region 120 may reflect again the state deterioration of the normal memory region 130. Hence, the deterioration state of the normal memory cells may again be monitored by monitoring the deterioration state of the reference memory cells.

As described above, the reference memory region 120 may be monitored in state deterioration by the state monitor unit 111. The reference memory region 120 may store predetermined data such that state deterioration may be determined through the change of the stored data. For example, all the reference memory cells included in the reference memory region 120 may be written to exist in the predetermined state.

The normal memory region 130 may store various data including the data received from the controller, and the refresh unit 112 may perform a refresh operation for the normal memory region 130 based on a state deterioration determination of the reference memory region 120 made by the state monitor unit 111.

Figure 2A:
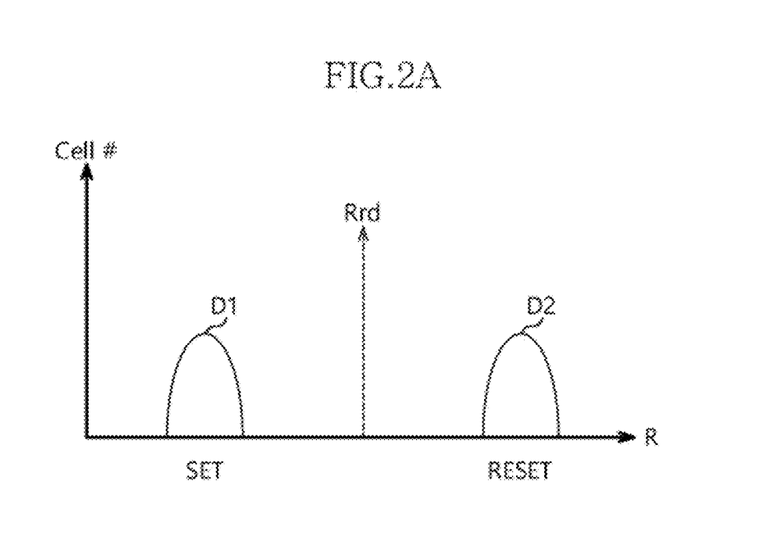
FIGS. 2A and 2B are diagrams illustrating examples of the drift phenomenon of memory cells.
Figure 2B:
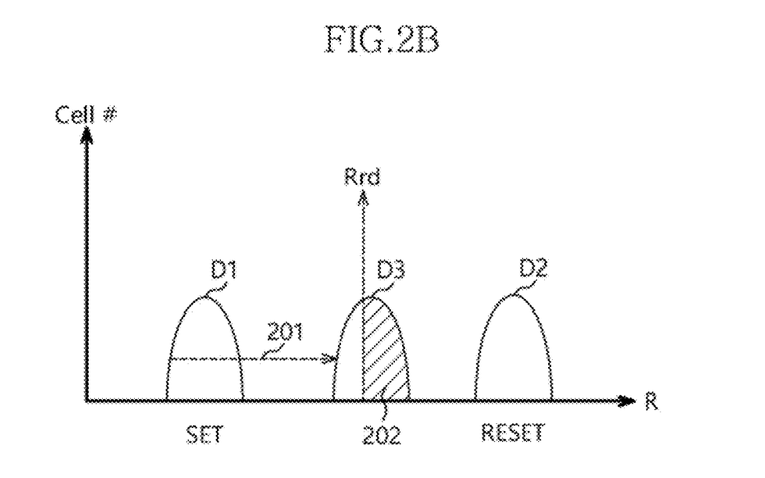

FIGS. 2A and 2B are diagrams illustrating examples of the drift phenomenon of memory cells. In FIGS. 2A and 2B, a horizontal axis R may mean the resistance value of a memory cell, and a vertical axis Cell # may mean the number of memory cells.

First, each of the memory cells of the reference memory region 120 and the normal memory region 130 may exist in a set state (SET) or a reset state (RESET) depending on the data value stored therein through a write operation. The set state and the reset state may be identified by the resistance value of a memory cell. In other words, a memory cell which has a resistance value less than a read resistance value Rrd may exist in the set state, and a memory cell which has a resistance value greater than or equal to the read resistance value Rrd may exist in the reset state. In FIG. 2A, a state distribution D1 may include memory cells which are in the set state (SET), and a state distribution D2 may include memory cells which are in the reset state (RESET).

A read operation for a memory cell may be performed by applying predetermined current to the memory cell and comparing the amount of current passed through the memory cell with a reference current amount. The reference current amount may be an amount of current corresponding to the read resistance value Rrd, that is, the amount of current passed through a memory cell which has the read resistance value Rrd. Therefore, when the resistance value of a memory cell is less than the read resistance value Rrd, that is, when the amount of current passed through the memory cell is greater than or equal to the reference current amount, the memory cell may be determined to be in the set state, and data corresponding to the set state, that is, set data may be read. When the resistance value of a memory cell is greater than or equal to the read resistance value Rrd, that is, when the amount of current passed through the memory cell is less than the reference current amount, the memory cell may be determined to be in the reset state, and data corresponding to the reset state, that is, reset data may be read.

Referring to FIG. 2B, if a drift phenomenon 201 in which the resistance value of a memory cell increases as time passes occurs, the state distribution D1 may move to a state distribution D3. At this time, if a read operation is performed based on the read resistance value Rrd, since reset data may be read from memory cells 202 in which set data are written, read errors may occur. The drift phenomenon 201 may occur in the same manner in the reference memory region 120 and the normal memory region 130.

Figure 3A:
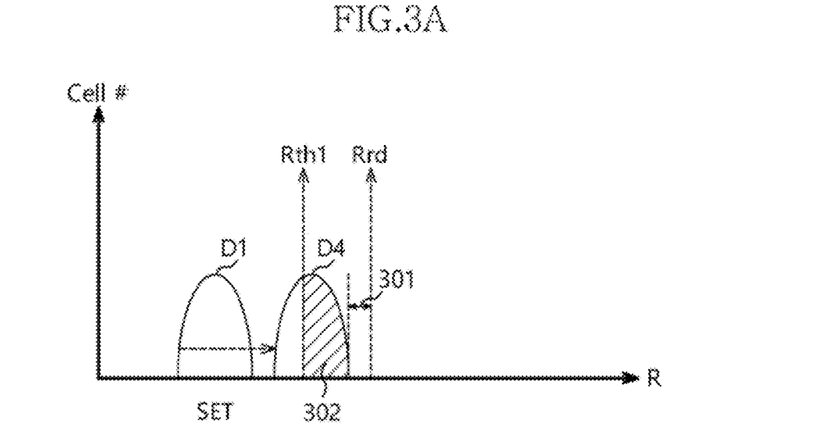
FIGS. 3A and 3B are diagrams illustrating examples of a method for operating a state monitor unit with respect to a reference memory region.
Figure 3B:
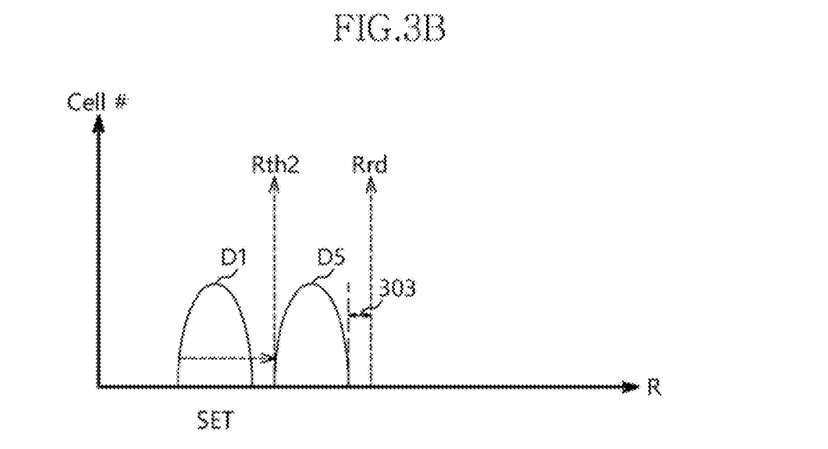

FIGS. 3A and 3B are diagrams illustrating examples of a method for operating the state monitor unit 111 with respect to the reference memory region 120.

Referring to FIG. 3A, first, the reference memory cells of the reference memory region 120 may be written to exist in the set state. Accordingly, the reference memory cells may form a state distribution D1. Thereafter, as described above with reference to FIG. 2B, the resistance values of the reference memory cells may increase by a drift phenomenon, and the state distribution D1 may move to a state distribution D4.

The state monitor unit 111 may count, among the reference memory cells, reference memory cells of which states deteriorated, based on a threshold resistance value Rth1. That is, the state monitor unit 111 may count, among the reference memory cells, target reference memory cells 302 which have resistance values greater than or equal to the threshold resistance value Rth1.

In detail, the state monitor unit 111 may perform a read operation for the reference memory cells, based on a threshold current amount corresponding to the threshold resistance value Rth1. The threshold current amount may be an amount of current corresponding to the threshold resistance value Rth1. That is, the threshold current amount may be the amount of current passed through a memory cell which has the threshold resistance value Rth1. Namely, the state monitor unit 111 may apply current to the reference memory cells, compare the amounts of current passed through the reference memory cells with the threshold current amount, and count reference memory cells corresponding to amounts of current less than the threshold current amount, as the target reference memory cells 302. That is to say, the state monitor unit 111 may count reference memory cells from each of which reset data is read in a read operation based on the threshold current amount corresponding to the threshold resistance value Rth1, as the target reference memory cells 302.

The state monitor unit 111 may determine to perform a refresh operation for the normal memory region 130, when a counted number of the target reference memory cells 302 exceeds a threshold number.

The threshold resistance value Rth1 may be set to a value less than a read resistance value Rrd, and the threshold number may be set in consideration of a margin 301. The error safety margin 301 ensures that a refresh operation in the normal memory region will be initiated before any stored data therein are lost.

FIG. 3B shows a case in which a state monitor operation is performed according to a threshold resistance value Rth2 set differently from FIG. 3A and a threshold number.

Also in FIG. 3B, the reference memory cells of the reference memory region 120 may be written to exist in the set state (SET), and form the state distribution D1.

The state monitor unit 111 may determine to perform a refresh operation, when all the reference memory cells have resistance values greater than or equal to the threshold resistance value Rth2. That is, the state monitor unit 111 may determine to perform a refresh operation, when the state distribution D1 of the reference memory cells moves to a state distribution D5. In other words, the state monitor unit 111 may determine to perform a refresh operation, when reset data is read from each of all the reference memory cells in a read operation based on a threshold current amount corresponding to the threshold resistance value Rth2.

The threshold resistance value Rth2 may be set in consideration of a margin 303.

Meanwhile, a time required for the resistance value of a memory cell written to the set state to increase to the read resistance value Rrd, that is, a drift time, may be calculated experimentally, and a state monitor operation may be set to be performed cyclically within the calculated time. The drift time may be calculated through a test in which set data is written in a memory cell and then a read operation is repeated until reset data is read.

Figure 4:
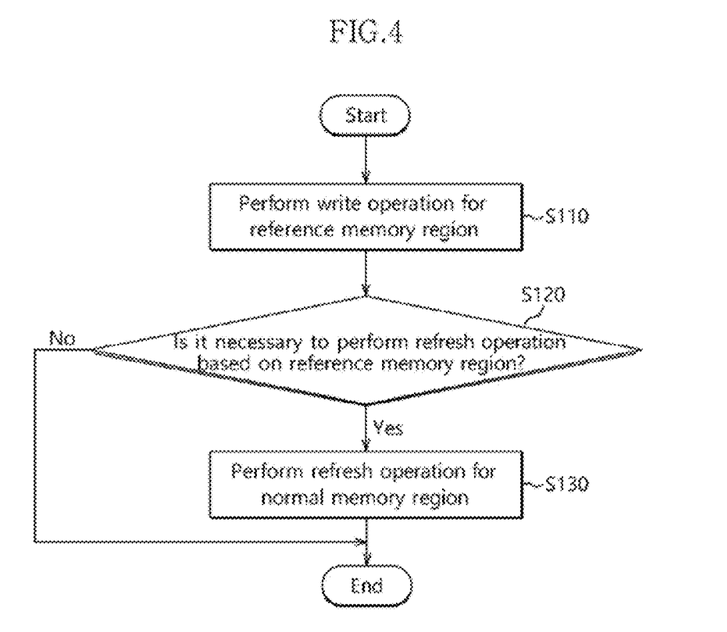
FIG. 4 is a flow chart illustrating the operation of the nonvolatile memory device shown in FIG. 1.

FIG. 4 is a flow chart illustrating the operation of the nonvolatile memory device 100 shown in FIG. 1.

Referring to FIG. 4, at step S110, the control block 110 may perform a write operation for the reference memory cells of the reference memory region 120 such that the reference memory cells exist in the predetermined state, for example, the set state.

At step S120, the state monitor unit 111 may determine whether to perform a refresh operation, based on the reference memory region 120. The detailed operation of the state monitor unit 111 will be described in detail with reference to FIG. 5. When it is determined to perform a refresh operation (S120, Yes), the process may proceed to step S130. When it is determined to not perform a refresh operation (S120, No), the process may be ended.

At the step S130, the refresh unit 112 may perform a refresh operation for the normal memory region 130.

Figure 5:
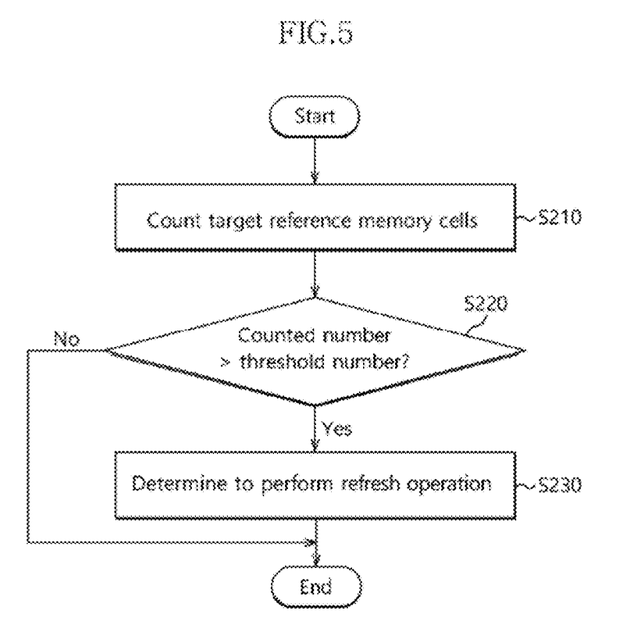
FIG. 5 is a flow chart illustrating the operation of the state monitor unit shown in FIG. 1.

FIG. 5 is a flow chart illustrating the operation of the state monitor unit 111 shown in FIG. 1. The process shown in FIG. 5 may be an example of the step S120 of FIG. 4.

At step S210, the state monitor unit 111 may count target reference memory cells among the one or more reference memory cells included in the reference memory region 120. Each of the target reference memory cells may have a resistance value greater than or equal to a threshold resistance value. The state monitor unit 111 may apply current to the reference memory cells, compare the amounts of current passed through the reference memory cells with a threshold current amount corresponding to the threshold resistance value, and count reference memory cells corresponding to amounts of current less than the threshold current amount, as the target reference memory cells.

At step S220, the state monitor unit 111 may determine whether a counted number of the target reference memory cells exceeds a threshold number. When it is determined that the counted number of the target reference memory cells exceeds the threshold number (S220, Yes), the process may proceed to step S230. When it is determined that the counted number of the target reference memory cells does not exceed the threshold number (S220, No), the process may be ended.

At the step S230, the state monitor unit 111 may determine to perform a refresh operation. Hence, the state monitor unit 111 may direct the refresh unit 112 to perform a refresh operation to the normal memory region 130.

FIG. 6 is a block diagram illustrating a data storage device 1 in accordance with an embodiment.

The data storage device 1 may include a controller 10 and a nonvolatile memory device 200.

The controller 10 may control the write operation and the read operation of the nonvolatile memory device 200. Further, the controller 10 may control the refresh operation of the nonvolatile memory device 200 through a refresh management unit 11 to ensure the data reliability of the nonvolatile memory device 200, and perform a wear leveling operation through a wear leveling unit 12 to extend the lifetime of the nonvolatile memory device 200.

The refresh management unit 11 may control the nonvolatile memory device 200 to perform a refresh operation efficiently. In detail, when it is determined by a state monitor unit 211 through a method as described above that a refresh operation should be performed, the refresh management unit 11 may determine a first memory region 231 in a normal memory region 230 based on the execution history of wear leveling operations, i.e. the wear leveling operation data, and control the nonvolatile memory device 200 to perform a refresh operation for a second memory region 232 excluding the first memory region 231 in the normal memory region 230. The first memory region 231 may include memory units for which wear leveling operations are performed from after a previous refresh operation is performed to till it is determined to perform a current refresh operation. As will be described later, the first memory region 231 may not need a refresh operation since the first memory region 231 has ever been removed of a drift phenomenon through wear leveling operations. Therefore, because an unnecessary refresh operation is not performed, power and time required for the refresh operation may be saved.

The wear leveling unit 12 may perform a wear leveling operation such that the normal memory region 230 of the nonvolatile memory device 200 is evenly worn. Meanwhile, a wear leveling operation may be followed by a write operation. Therefore, the first memory region 231 for which wear leveling operations are performed may not need a refresh operation since the first memory region 231 has ever been removed of a drift phenomenon. The wear leveling unit 12 may store information on memory units for which wear leveling operations are performed.

The nonvolatile memory device 200 may be configured and operate substantially similarly to the nonvolatile memory device 100 of FIG. 1. In detail, the nonvolatile memory device 200 may include a control block 210 including the state monitor unit 211 and a refresh unit 212, a reference memory region 220, and the normal memory region 230. When the state monitor unit 211 determines, by monitoring the state change of the reference memory region 220, that a refresh operation should be performed, the state monitor unit 211 may make a report to the refresh management unit 11 of the controller 10 such that the first memory region 231 for which a refresh operation is not to be performed is determined. The refresh unit 212 may perform a refresh operation for the second memory region 232 excluding the first memory region 231 in the normal memory region 230, according to control of the refresh management unit 11.

Figure 7:
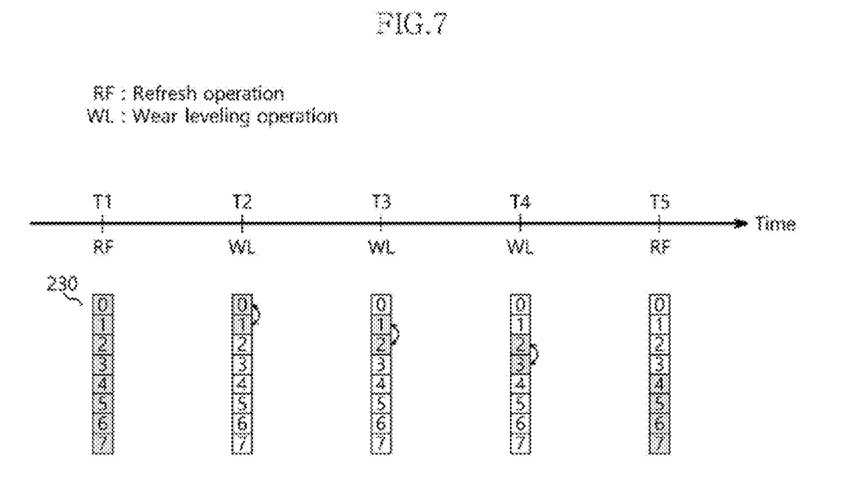
FIG. 7 is a diagram illustrating a method for performing a wear leveling operation and a refresh operation in the data storage device shown in FIG. 6.

FIG. 7 is a diagram illustrating a method for performing a wear leveling operation and a refresh operation in the data storage device 1 shown in FIG. 6. For the sake of convenience in explanation, FIG. 7 illustrates the normal memory region 230 which includes memory units corresponding to addresses "0" to "7." However, it should be understood that the invention is not limited in this way and that a normal region may include any number of memory units without departing from the scope of the invention.

Before making descriptions, it is to be noted that, in FIG. 7, a wear leveling operation may be performed for first and second memory units selected according to a swap algorithm. In detail, the wear leveling unit 12 may select the first memory unit sequentially among the memory units, for example, by increasing an address, at each time of performing a wear leveling operation. For example, the wear leveling unit 12 may select the first memory unit sequentially among the memory units by increasing an address. The wear leveling unit 12 may select a memory unit having an address next to the first memory unit, as the second memory unit, at each time of performing a wear leveling operation. The wear leveling unit 12 may exchange and store the data stored in the first memory unit and the data stored in the second memory unit, at each time of performing a wear leveling operation. Hence, the memory units may be evenly accessed and wear-leveled. Meanwhile, according to an embodiment, the second memory unit may be not a memory unit having an address next to the first memory unit but another memory unit selected according to a prescribed rule.

Referring to FIG. 7, at a time T1, when it is determined by the state monitor unit 211 that a refresh operation is needed, the refresh management unit 11 may control the nonvolatile memory device 200 to perform a refresh operation (RF) for all the memory units having the addresses "0" to "7." The determination that a refresh operation is needed may be made as described earlier using, for example, the state monitor unit 211 of the non-volatile memory device 200.

Between the time T1 and a time T2, various host operations such as a write operation and a read operation may be performed according to control of a host device (not shown). Meanwhile, a wear leveling operation may be performed cyclically, for example, each time write operations by the host device are performed by a predetermined number of times. As such, wear leveling operations (WL) may be performed according to the swap algorithm at the time T2, a time T3 and a time T4.

In detail, at the time T2, the wear leveling unit 12 may exchange and store the data stored in the first and second memory units, that is, the memory units having the addresses "0" and "1." Further, at the time T3, the wear leveling unit 12 may exchange and store the data stored in the memory units having the addresses "1" and "2." Moreover, at the time T4, the wear leveling unit 12 may exchange and store the data stored in the memory units having the addresses "2" and "3."

At a time T5, when it is determined by the state monitor unit 211 that a refresh operation is needed, the refresh management unit 11 may control the nonvolatile memory device 200 to perform a refresh operation (RF) for only the memory units having the addresses "4" to "7" excluding the memory units having the addresses "0" to "3" for which the wear leveling operations are performed between the time T1 when the previous refresh operation is performed and the time T5.

That is to say, for example, as the wear leveling operation is performed at the time T2 for the memory unit having the address "0," the drift phenomenon occurred therein may be removed. Therefore, because only a slight drift phenomenon occurs in the memory unit having the address "0" from the time T2 to the time T5, a refresh operation may be omitted. Similarly to this, because drift phenomenon have ever been removed in the memory units having the addresses "1" to "3," a refresh operation may be omitted, whereby power and time required for the refresh operation may be saved.

Figure 8:
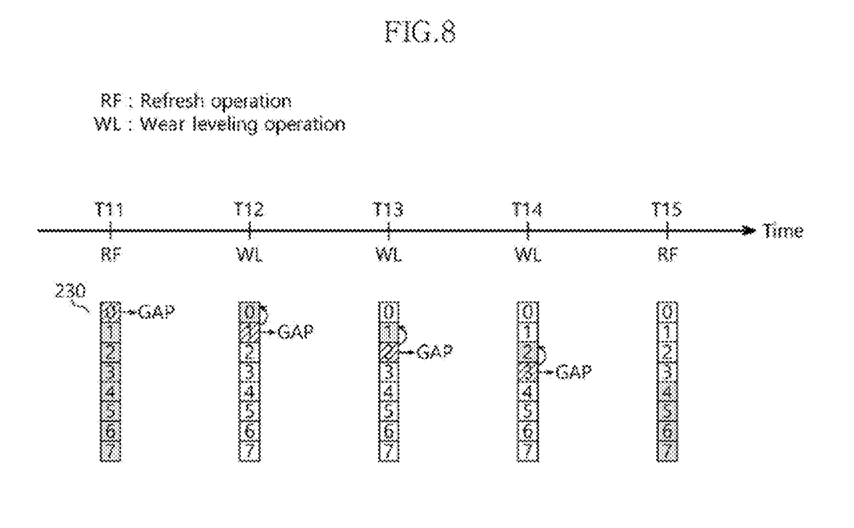
FIG. 8 is a diagram illustrating a method for performing a wear leveling operation and a refresh operation in the data storage device shown in FIG. 6.

FIG. 8 is a diagram illustrating a method for performing a wear leveling operation and a refresh operation in the data storage device 1 shown in FIG. 6. Unlike that the swap algorithm is applied to a wear leveling operation in FIG. 7, in FIG. 8, a wear leveling operation may be performed according to a gap designation algorithm.

Even in the gap designation algorithm, two memory units for which a wear leveling operation is to be performed, that is, a memory unit to be designated as a gap and a memory unit previously designated as a gap, may be selected. The wear leveling unit 12 may select a memory unit to be designated as a gap, sequentially among the memory units, for example, by increasing an address, at each time of performing a wear leveling operation. For example, the wear leveling unit 12 may select a memory unit to be designated as a gap, sequentially among the memory units, by increasing an address. A memory unit designated as a gap may not be used to store data. The wear leveling unit 12 may copy the data stored in a memory unit to be designated as a gap, to the memory unit previously designated as a gap, at each time of performing a wear leveling operation. In other words, the wear leveling unit 12 may change a gap by increasing an address, at each time of performing a wear leveling operation. As a result, the memory units may be evenly accessed.

In detail, at a time T11, as it is determined by the state monitor unit 211 that a refresh operation is needed, a refresh operation (RF) may be performed for the memory units having the addresses "1" to "7." The memory unit having the address "0" may be a region which is designated as a gap and is not used to store data.

After write operations by a host device (not shown) are performed by a predetermined number of times from the time T11, at a time T12, the wear leveling unit 12 may copy the data stored in the memory unit having the address "1" to the memory unit having the address "0" and may change a gap from the memory unit having the address "0" to the memory unit having the address "1." Similarly, after write operations by the host device are performed by the predetermined number of times from the time T12, at a time T13, the wear leveling unit 12 may copy the data stored in the memory unit having the address "2" to the memory unit having the address "1" and may change a gap from the memory unit having the address "1" to the memory unit having the address "2." Also, after write operations by the host device are performed by the predetermined number of times from the time T13, at a time T14, the wear leveling unit 12 may copy the data stored in the memory unit having the address "3" to the memory unit having the address "2" and may change a gap from the memory unit having the address "2" to the memory unit having the address "3."

At a time T15, a refresh operation may be performed according to the determination of the state monitor unit 211. At this time, the refresh management unit 11 may control the nonvolatile memory device 200 to perform a refresh operation (RF) for only the memory units having the addresses "4" to "7" excluding the memory units for which the wear leveling operations are performed between the time T11 when the previous refresh operation is performed and the time T15, that is, the memory units having the addresses "0" to "3" each designated as a gap. Namely, because the memory units having the addresses "0" to "2" each designated as a gap between the times T11 and T15 have ever been removed of drift phenomenon through the write operation and the memory unit having the address "3" as a current gap does not store data, a refresh operation is not needed therefor.

Figure 9:
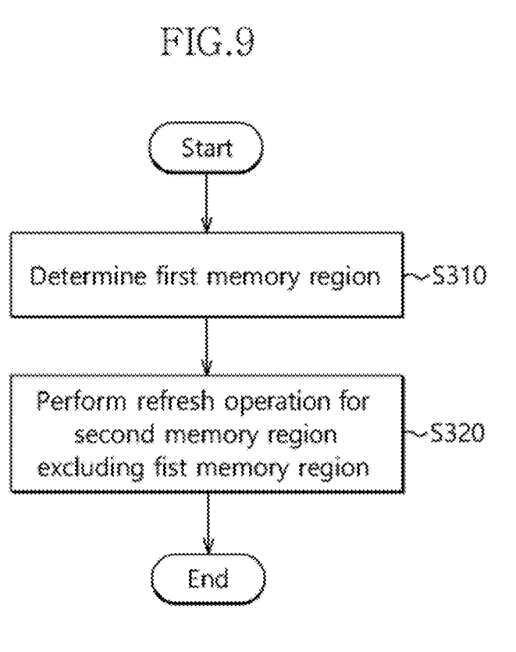
FIG. 9 is a flow chart illustrating an operation method of the controller shown in FIG. 6.

FIG. 9 is a flow chart illustrating an operation method of the controller 10 shown in FIG. 6. Before starting the process of FIG. 9, the controller 10 may determine to control the refresh operation of the nonvolatile memory device 200, according to the report of the state monitor unit 211.

At step S310, the controller 10 may determine the first memory region 231 in the normal memory region 230, based on the wear leveling operation data. According to an embodiment, the controller 10 may determine memory units for which swap operations are performed from after a previous refresh operation is performed, as the first memory region 231. According to an embodiment, the controller 10 may determine memory units each of which is designated as a gap from after a previous refresh operation is performed, as the first memory region 231.

At step S320, the nonvolatile memory device 200 may perform a refresh operation for the second memory region 232 excluding the first memory region 231 in the normal memory region 230, according to control of the controller 10.

While various embodiments have been described above, it will be understood to those skilled in the art that the embodiments described are examples only. Accordingly, the data storage device and the operating method thereof described herein should not be limited to the described embodiments. It will be apparent to those skilled in the art to which the present invention pertains that various other changes and modifications may be made without departing from the spirit and scope of the invention as defined in the following claims.

What is claimed is:

1. A data storage device comprising:
a nonvolatile memory device including a reference memory region and a normal memory region, and suitable for determining whether to perform a refresh operation, based on the reference memory region; and
a controller suitable for determining a first memory region in the normal memory region based on wear leveling operation data, and controlling the nonvolatile memory device to perform the refresh operation for a second memory region excluding the first memory region in the normal memory region.

2. The data storage device according to claim 1,
wherein the nonvolatile memory device counts at least one target reference memory cell among one or more reference memory cells included in the reference memory region, and determines to perform the refresh operation, when a counted number of the target reference memory cell exceeds a threshold number, and
wherein the target reference memory cell has a resistance value greater than or equal to a threshold resistance value.

3. The data storage device according to claim 2, wherein the nonvolatile memory device applies current to the reference memory cells, compares amounts of current passed through the reference memory cells with a threshold current amount corresponding to the threshold resistance value, and counts at least one reference memory cell corresponding to amounts of current less than the threshold current amount, as the target reference memory cell.

4. The data storage device according to claim 2, wherein the nonvolatile memory device performs, after performing the refresh operation, a write operation for the reference memory cells such that the reference memory cells exist in a predetermined state.

5. The data storage device according to claim 1, wherein the controller determines memory units for which swap operations are performed from after a previous refresh operation is performed, as the first memory region, based on the wear leveling operation data.

6. The data storage device according to claim 1, wherein the controller determines memory units each of which is designated as a gap from after a previous refresh operation is performed, as the first memory region, based on the wear leveling operation data.

7. A method for operating a data storage device, comprising:
determining whether to perform a refresh operation, based on a reference memory region of a nonvolatile memory device;
determining a first memory region in a normal memory region of the nonvolatile memory device based on a wear leveling operation data depending on a determination result; and
performing the refresh operation for a second memory region excluding the first memory region in the normal memory region.

8. The method according to claim 7, wherein the determining of whether to perform the refresh operation comprises:
counting at least one target reference memory cell among one or more reference memory cells included in the reference memory region, the target reference memory cell having a resistance value greater than or equal to a threshold resistance value; and
determining to perform the refresh operation, when a counted number of the target reference memory cell exceeds a threshold number.

9. The method according to claim 8, wherein the counting of the target reference memory cells comprises:
applying current to the reference memory cells;
comparing amounts of current passed through the reference memory cells with a threshold current amount corresponding to the threshold resistance value; and
counting at least one reference memory cell corresponding to amounts of current less than the threshold current amount, as the target reference memory cell.

10. The method according to claim 8, further comprising:
performing, after performing the refresh operation, a write operation for the reference memory cells such that the reference memory cells exist in a predetermined state.

11. The method according to claim 7, wherein the determining of the first memory region comprises:
determining memory units for which swap operations are performed from after a previous refresh operation is performed, as the first memory region, based on the wear leveling operation data.

12. The method according to claim 7, wherein the determining of the first memory region comprises:
determining memory units each of which is designated as a gap from after a previous refresh operation is performed, as the first memory region, based on the wear leveling operation data.

13. A nonvolatile memory device comprising:
a reference memory region;
a normal memory region; and
a control block suitable for determining whether to perform a refresh operation on the normal memory region, based on a counted number of at least one target reference memory cell among one or more reference memory cells included in the reference memory region, wherein the target reference memory cell has a resistance value greater than or equal to a threshold resistance value.

14. The nonvolatile memory device according to claim 13,
wherein the control block counts the at least one target reference memory cell among the one or more reference memory cells, and determines to perform the refresh operation on the normal memory region, when the counted number of the target reference memory cell exceeds a threshold number.

15. The nonvolatile memory device according to claim 13, wherein the control block applies current to the reference memory cells, compares amounts of current passed through the reference memory cells with a threshold current amount corresponding to the threshold resistance value, and counts at least one reference memory cell corresponding to amounts of current less than the threshold current amount, as the target reference memory cell.

16. The nonvolatile memory device according to claim 13, wherein the control block performs, after performing the refresh operation, a write operation for the reference memory cells such that the reference memory cells exist in a predetermined state.

* * * * *